United States Patent
Zhao et al.

(10) Patent No.: US 9,312,223 B2
(45) Date of Patent: Apr. 12, 2016

(54) METHOD FOR FABRICATING A CARBON NANOTUBE INTERCONNECTION STRUCTURE

(75) Inventors: Yuhang Zhao, Shanghai (CN); Xiaoxu Kang, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 180 days.

(21) Appl. No.: 14/125,313

(22) PCT Filed: Dec. 31, 2011

(86) PCT No.: PCT/CN2011/085150
§ 371 (c)(1),
(2), (4) Date: Dec. 11, 2013

(87) PCT Pub. No.: WO2013/082844
PCT Pub. Date: Jun. 13, 2013

(65) Prior Publication Data
US 2014/0138829 A1    May 22, 2014

(30) Foreign Application Priority Data
Dec. 6, 2011  (CN) .......................... 2011 1 0401441

(51) Int. Cl.
| | |
|---|---|
| *H01L 23/532* | (2006.01) |
| *H01L 21/768* | (2006.01) |
| *H01L 21/285* | (2006.01) |
| *H01L 23/522* | (2006.01) |

(52) U.S. Cl.
CPC .... *H01L 23/53276* (2013.01); *H01L 21/28562* (2013.01); *H01L 21/7682* (2013.01); *H01L 21/7684* (2013.01); *H01L 21/76801* (2013.01); *H01L 21/76838* (2013.01); *H01L 21/76877* (2013.01); *H01L 21/76879* (2013.01); *H01L 21/76895* (2013.01); *H01L 23/5222* (2013.01); *H01L 23/53295* (2013.01); *H01L 2221/1094* (2013.01); *H01L 2924/0002* (2013.01)

(58) Field of Classification Search
CPC .................... H01L 21/76879; H01L 21/76897
See application file for complete search history.

(56) References Cited

U.S. PATENT DOCUMENTS

| | | | | |
|---|---|---|---|---|
| 6,339,281 | B2 * | 1/2002 | Lee ............................... | 313/309 |
| 6,448,701 | B1 * | 9/2002 | Hsu ........................ | B82Y 10/00 313/309 |
| 6,616,497 | B1 * | 9/2003 | Choi ...................... | B82Y 10/00 445/24 |
| 6,661,094 | B2 * | 12/2003 | Morrow ............ | H01L 21/76808 257/751 |
| 7,135,773 | B2 * | 11/2006 | Furukawa .............. | B82Y 10/00 257/758 |
| 7,268,423 | B2 * | 9/2007 | Beer ....................... | B82Y 10/00 257/688 |
| 7,518,247 | B2 * | 4/2009 | Sakamoto .............. | B82Y 10/00 257/758 |
| 7,659,624 | B2 * | 2/2010 | Mayya Kolake ...... | H01L 21/288 257/288 |

(Continued)

*Primary Examiner* — Matthew Gordon
*Assistant Examiner* — Gardner W Swan

(57) ABSTRACT

The present invention relates to an interconnection structure and a method for fabricating the same. According to the present invention, cavities are formed between the interconnection dielectric by using a sacrificial layer, carbon nanotubes are used as the interconnection material for local interconnection between via holes, graphene nanoribbons are used as the interconnection material for metal lines, and cavities are included in the interconnection dielectric. In addition, the conventional CMOS BEOL Cu interconnection technique is applied to the intermediate interconnection level and the global interconnection level. In this way, the high parasitic resistance and parasitic capacitance in the Cu interconnection technique, which may occur when the local interconnection is relatively small in size, can be effectively overcome.

16 Claims, 9 Drawing Sheets

(56) References Cited

U.S. PATENT DOCUMENTS

| | | | |
|---|---|---|---|
| 8,298,911 B2* | 10/2012 | Lee | H01L 21/7682 257/758 |
| 8,399,772 B2* | 3/2013 | Gosset | B82Y 10/00 174/250 |
| 8,487,449 B2* | 7/2013 | Wada | B82Y 10/00 257/758 |
| 8,598,708 B2* | 12/2013 | Dijon | H01L 21/7682 257/758 |
| 2004/0219773 A1* | 11/2004 | Choi | B82Y 10/00 438/597 |
| 2006/0066217 A1* | 3/2006 | Son | B82Y 10/00 313/497 |
| 2007/0018260 A1* | 1/2007 | Jaiprakash | B81C 1/00142 257/414 |
| 2009/0146304 A1* | 6/2009 | Son | H01L 21/76834 257/750 |
| 2009/0272565 A1* | 11/2009 | Gosset et al. | 174/257 |
| 2011/0101528 A1* | 5/2011 | Akimoto | H01L 21/76802 257/751 |

* cited by examiner

METHOD FOR FABRICATING A CARBON NANOTUBE INTERCONNECTION STRUCTURE

CROSS REFERENCE TO RELATED APPLICATIONS

This application claims the priority benefit of International Patent Application Ser. No. PCT/CN2011/085,150, filed Dec. 31, 2011, which is related to and claims the priority benefit of China patent application serial no. 201110401441.9 filed Dec. 6, 2011. The entirety of each of the above-mentioned patent applications is hereby incorporated by reference herein and made a part of this specification.

FIELD OF THE INVENTION

The present invention relates to the field of semiconductor and more particularly, to a Complementary Metal Oxide Semiconductor (CMOS) device structural unit and a method for preparing spacer to reduce coupling interference in Metal-Oxide-Semiconductor Field Effect Transistor (MOSFET).

BACKGROUND OF THE INVENTION

In the modern society, the amount of digital information is increasing dramatically, which poses an ever increasing demand on processing, transmission, and storage of the information. As driven by this demand, the semiconductor industry (especially the CMOS technique), which is the backbone of the information industry, has been developing rapidly according to Moore's Law and has developed the most rapidly over the past 50 years.

With the rapid development of the CMOS technique, the integration degree of the device on a chip is increasing continuously and the speed of the chip is also becoming faster. To meet the demand regarding the integration degree and speed of the device, Cu interconnection has gradually become popular and replacing the conventional Al interconnection. At the same time, the line width of the interconnection has decreased continuously, and the wiring density has increased. With further decrease in the line width of the Cu interconnection, electron scattering resulting from the grain boundary and surface will lead to significant increase in the resistivity of Cu, which will increase the interconnection delay due to the resistance and capacitance (RC) and reduce the overall performance of the chip.

Device delay and interconnection delay jointly determine the maximum operation frequency of a circuit. As the device decreases continuously in size, the interconnection delay has surpassed the delay of device level, and has become a dominant factor of influencing the operation frequency of the circuit. Especially with the decrease in the line width, the electron transport in Cu wire suffers from a more intensive scattering from the surface and the grain boundary, and the resistivity of a Cu wire with a line width of 100 nm or less increases dramatically, which may greatly affect the performance of the circuit. The use of a low-k dielectric may reduce the parasitic capacitance introduced by the interconnection. However, the application of low-k dielectric is also accompanied with several issues regarding e.g. integration, reliability, and the like. Besides, the dielectric constant of a low-k material will reach its limit around 1.5. It's expected that the approach of depositing Cu by an electrochemical method or CVD and the application of a low-k material may continue to 2020. Nevertheless, the research and development of a post-Cu interconnection technique (comprising an optical interconnection, carbon nano-material interconnection, and the like) is of great urgency.

Graphene is a novel material. In fact, it is a monoatomic layer of graphite, a monolayer thin film with a hexagonal honeycomb lattice plane composed by a monolayer of carbon atoms, and two-dimensional material with a thickness of a carbon atom. In contrast, a graphene nanoribbon is ribbon-shaped graphene, and can be understood as an expanded single-wall carbon nanotube or a patterned graphene structure. Graphene exhibits excellent properties, such as high carrier mobility, high current density, high mechanical strength, high thermal conductivity, and the like.

In addition to the excellent properties of graphene, graphene nanoribbons have their own unique characteristics as follow.

1. They have a high electrical conductivity. It has been reported that the mean free path may amount to several hundred nanometers, and the high electron mobility is about few micrometers. Multi-layer graphite nanoribbons in parallel connection can significantly reduce the resistance, improve the performance, and show under small dimension a much better performance than that of Cu interconnection.

2. They have a superior anti-electromigration performance. The neighboring carbon atoms are bonded by SP2 valence bonds. The mechanical strength and anti-electromigration performance are very excellent. They can withstand a current density of $10E9 A/cm^2$, which is larger than $10E6 A/cm^2$ of Cu.

3. They have an even better thermal conductivity. It is reported that the monolayer graphene has a thermal conductivity of 5300 W/mK. When applied to the interconnection technique, it may have an even better heat dissipating performance, and may improve the interconnection in term of reliability.

4. Depending on the edge state of GNR (grapheme nanoribbon), the resistivity may change from a semiconductor into a conductor. As shown in FIG. 1, a Zigzag edge topology 11 corresponds to a conductor, while the other armchair edge topology 12 corresponds to a semiconductor. Therefore, different applications may be designed with respect to the edge topology.

A carbon nanotube is a tube-shaped carbon molecule. Each carbon atom on the tube is SP2 hybridized, and is bonded with each other by a C—C σ bond, so as to form a hexagonal honeycomb structure as the framework of a carbon nanotube. A pair of p electrons which are not hybridized in each carbon atom form a conjugated π-electron cloud therebetween across the whole carbon nanotube. On the basis of the layer number in the tube, the carbon nanotube can be divided into a single-wall carbon nanotube and a multi-wall carbon nanotube. The nano-tube is very thin in the radius direction and is of nanoscale, while the length of a nanotube can be up to hundreds of micrometer.

The carbon nanotube has superior mechanical and electrical properties, and is also a high potential nano-material for applications in the interconnection technique, especially due to its oriented growth along the catalyst.

The excellent properties of a carbon-based nano-material have gradually drawn attention in the industry. As early as in IEDM2009, Yuji Awano, et al., indicated in a paper that graphene interconnection and carbon nanotube interconnection would be a very potential candidate for the interconnection technique in the post-CMOS time.

In the prior art advanced CMOS technique, the interconnection is generally defined as 3 kinds of levels, i.e., a local interconnection, an intermediate interconnection, and a global interconnection. The local interconnection is a level with a relatively small size, lies in the bottom of the interconnection structure, and comprises several levels like contact, metal1, via1, metal2, via2, and the like. Due to its relatively small size, the local interconnection has a relatively high wiring density, and tends to be affected in term of performance and reliability by parasitic resistance and parasitic capacitance as well as heat dissipation in the Cu interconnection with small size. The intermediate interconnection and the global interconnection have a relatively large size and a relatively low wiring density, and thus are less affected by the small size effect.

SUMMARY OF THE INVENTION

The object of the present invention is to provide an interconnection structure and a method for fabricating the same to effectively reduce interconnection RC delay, improve the performance of a chip, and bring the cost of a chip under control.

In the present invention, it is proposed an interconnection structure comprising an interconnection dielectric on a substrate, the interconnection dielectric comprises in an ascending order a first interconnection dielectric layer and a second interconnection dielectric layer, and further comprises a plurality of contact holes or via holes running through the first and second interconnection dielectric layer, wherein graphene interconnection lines are arranged on the second interconnection dielectric layer for connecting the carbon nanotubes, cavities are arranged between the first interconnection dielectric layer and carbon nanotubes, and the cavities adjoin the second interconnection dielectric at its top and adjoin the substrate at its bottom.

Preferably, the graphene nanoribbons may be a monolayer or multiple layers.

In the present invention, it is further proposed a method for fabricating an interconnection structure, comprising the steps of:
  depositing on a substrate a first interconnection dielectric layer;
  etching the first interconnection dielectric layer to form a plurality of supporting posts;
  depositing on the substrate a sacrificial layer, and polishing the sacrificial layer to the supporting posts;
  depositing on the surface of the above-mentioned structure a second interconnection dielectric layer;
  etching the second interconnection dielectric layer and the sacrificial layer at positions between the adjacent supporting posts to form a plurality of contact holes or via holes;
  removing the sacrificial layer between the second interconnection dielectric layer and the substrate;
  depositing on the surface of the above-mentioned structure a metal contact layer and a carbon nanotube catalyst layer, growing on the carbon nanotube catalyst layer in an ascending order carbon nanotubes, and forming closed cavities between the supporting posts and the carbon nanotubes;
  removing the carbon nanotubes and the metal contact layer on the second interconnection dielectric layer;
  growing a graphene thin film on the surface of the above-mentioned structure, and etching the graphene thin film to form graphene nanoribbons, thus forming interconnection lines.

Preferably, depositing on the substrate the first interconnection dielectric layer may further comprise depositing on the substrate an insulating layer.

Preferably, the sacrificial layer may contain a material of silicon or polyimide.

Preferably, the sacrificial layer may contain a material of silicon which may be removed by using $XeF_2$.

Preferably, the metal contact layer and carbon nanotube catalyst layer are deposited by PVD, CVD, PLD, or ALD.

Preferably, the metal contact layer may contain a material of Ta, TaN, Ti, or TiN, and the carbon nanotube catalyst may contain a material of Co, Ni, Pt, or Ru.

Preferably, growing on the surface of the above-mentioned structure the graphene thin film may be accomplished by means of direct deposition by CVD or a physical transferring.

Preferably, in a process in which the graphene thin film is directly deposited by CVD, PECVD, microwave plasma CVD, surface wave plasma CVD, LPCVD, or APCVD may be applied at a temperature of 300° C.~1200° C.

Preferably, forming the graphene thin film on the surface of the above-mentioned structure by means of a physical transferring may comprise the steps of:
  forming a graphene thin film on a bulk metal substrate;
  forming an organic glass on the graphene thin film;
  removing the bulk metal substrate;
  attaching the graphene thin film supported by the organic glass to the second interconnection dielectric layer;
  removing the organic glass.

Preferably, forming the graphene thin film on the bulk metal substrate may be accomplished by means of chemical vapor deposition or ion implantation.

Preferably, the bulk metal substrate may comprise a source substrate, $SiO_2$ and a metal catalyst deposited sequentially on the source substrate.

Preferably, the graphene nanoribbons may be a monolayer or multiple layers.

Preferably, the resistivity of the graphene nanoribbons is adjusted by doping or ion implantation.

Preferably, removing the carbon nanotubes and the metal contact layer on the second interconnection dielectric layer may be accomplished by means of chemical mechanical polishing.

Preferably, removing the carbon nanotubes and the metal contact layer on the second interconnection dielectric layer by chemical mechanical polishing further comprises forming an interconnection dielectric layer on the carbon nanotubes in the region of contact holes or via holes by deposition or spin coating.

As compared with the prior art, in the present invention, the carbon nanotube interconnection technique has been embedded into the conventional CMOS local Cu interconnection technique. The carbon nanotubes are used as the interconnection material for local interconnection between via holes or contact holes, the graphene nanoribbons are used as the interconnection material for local interconnection between metal lines, and the cavities are used as the interconnection dielectric for local interconnection. In addition, the conventional CMOS BEOL (back end of the line) Cu interconnection technique is applied to the intermediate interconnection level and the global interconnection level. In this way, the high parasitic resistance and parasitic capacitance in the Cu interconnection technique, which may occur when the local interconnection is relatively small in size, can be effectively overcome. In the present invention, the carbon nanotubes within via holes or contact holes, as well as the graphene nanoribbons for connecting the carbon nanotubes, greatly reduce the parasitic resistance. The cavities in the interconnection dielectric effectively reduce the interlayer parasitic capacitance. At the same time, the graphene nanoribbons are very thin, so that the parasitic capacitance between their connecting lines is also reduced greatly. Furthermore, the present invention is compatible with the current CMOS Cu interconnection technique, effectively reduces the interconnection RC delay, improves the performance of a chip, and brings the cost of a chip under control.

DETAILED DESCRIPTION OF THE EMBODIMENTS

The present invention will be described in further details hereinafter with reference to the accompanying drawings.

Many details are set forth in the following detailed description in order to provide a thorough understanding of the present invention. However, the present invention can be carried out in various manners different from those described herein, and it may occur to the skilled in the art that the present invention can be extended similarly without departing from the content thereof. Therefore, the present invention is not limited to the particular embodiments disclosed herein.

In addition, the present invention is described in details by reference with the schematic views. During elaborating embodiments of the present invention, the cross-sectional views showing the device structure may be magnified locally but not to scale for convenience in description. Besides, such schematic views are only provided as examples, and should be construed as limitation to the scope of the present invention. Furthermore, in the practical fabrication, three dimensional sizes like length, width, and depth should be included.

Figure 3A:
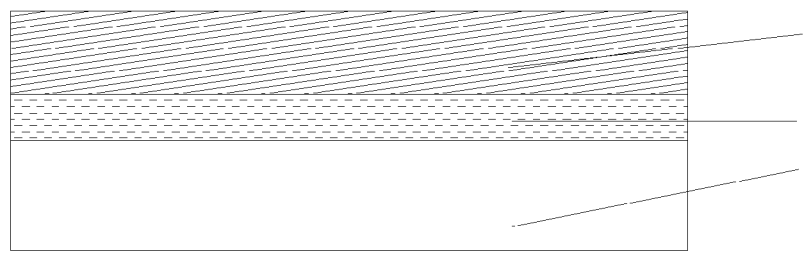
FIGS. 3A-3J are cross-sectional views illustrating respective processing steps in the method according to an embodiment of the present invention.
Figure 3B:
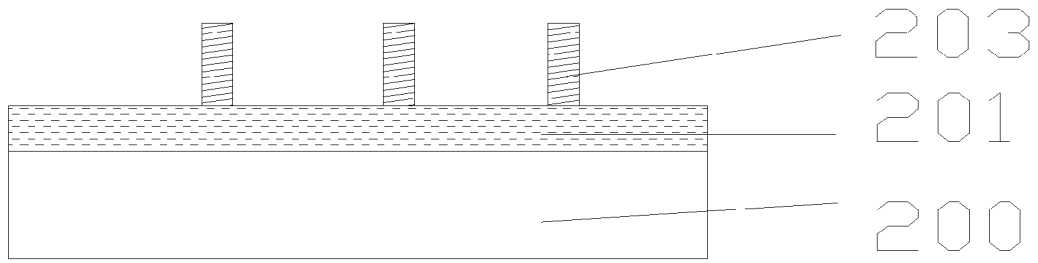
Figure 3C:
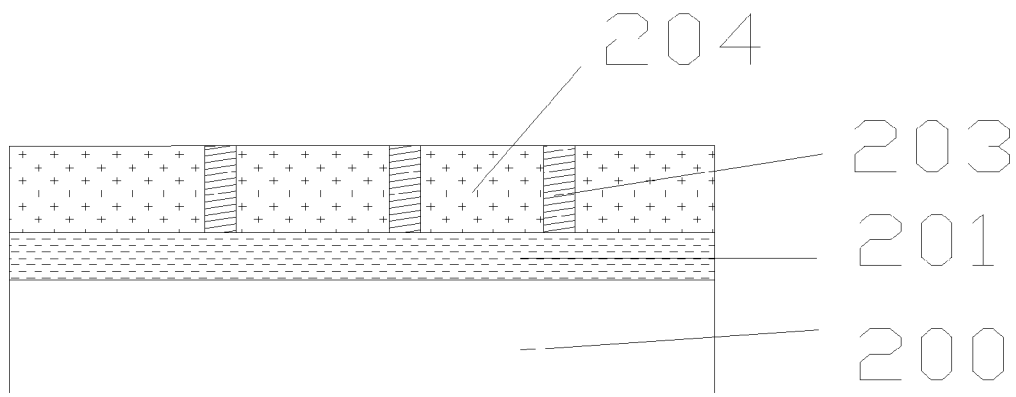
Figure 3D:
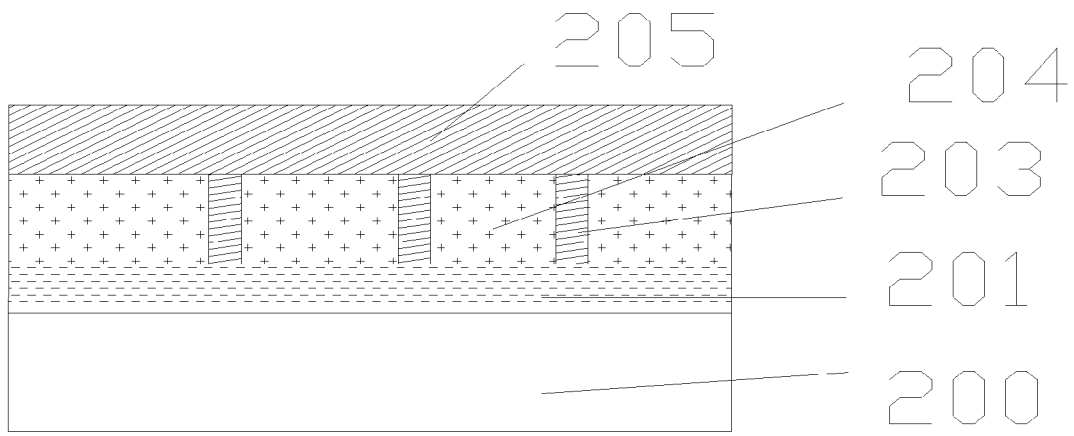
Figure 3E:
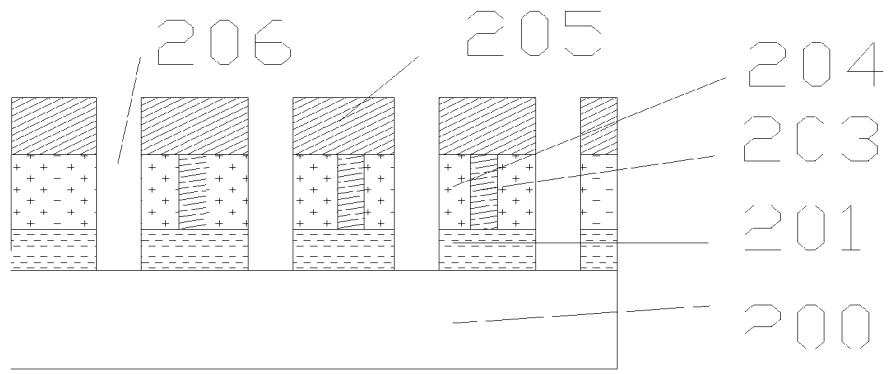
Figure 3F:
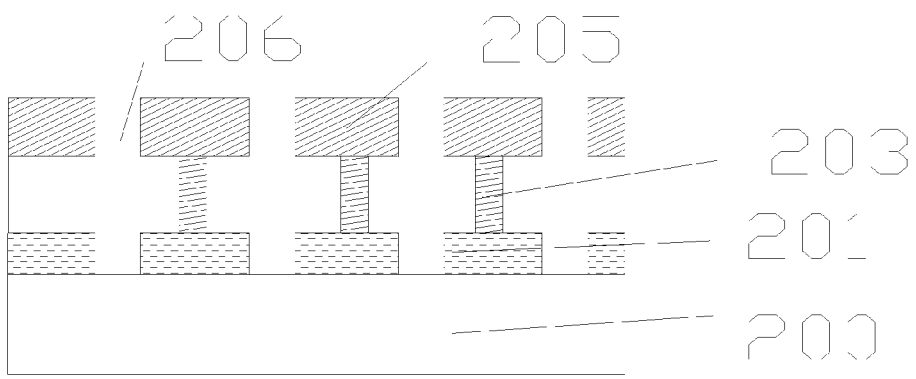
Figure 3G:
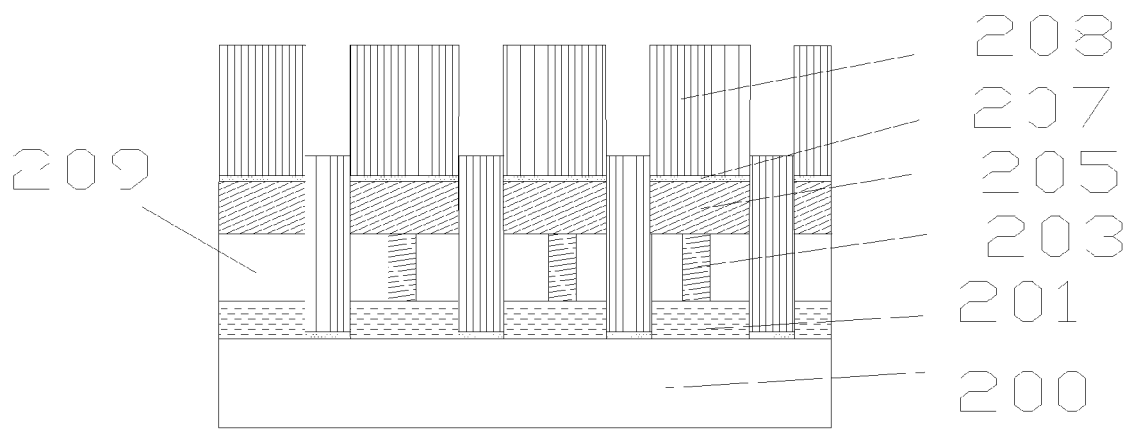
Figure 3H:
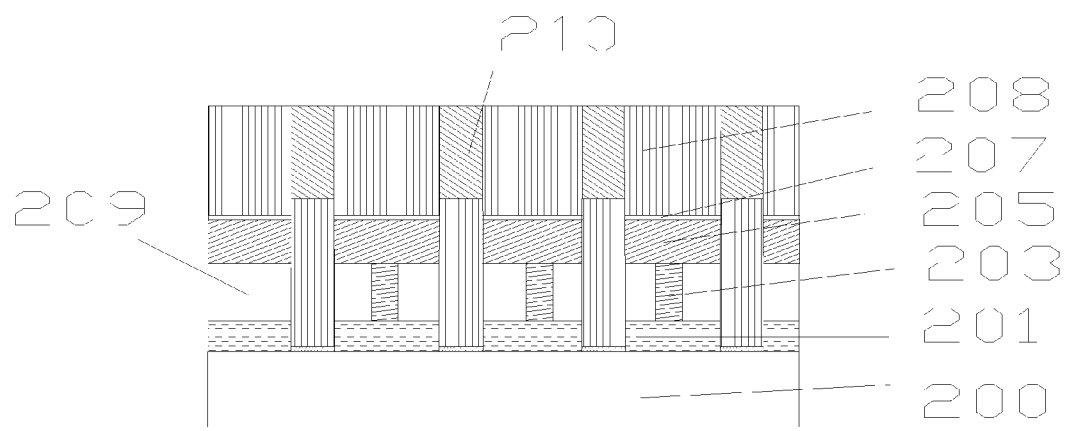
Figure 3I:
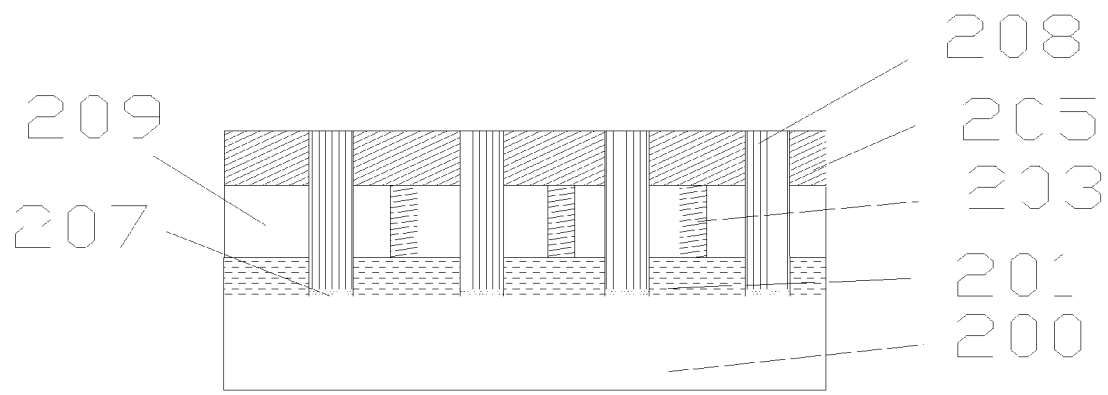
Figure 3J:
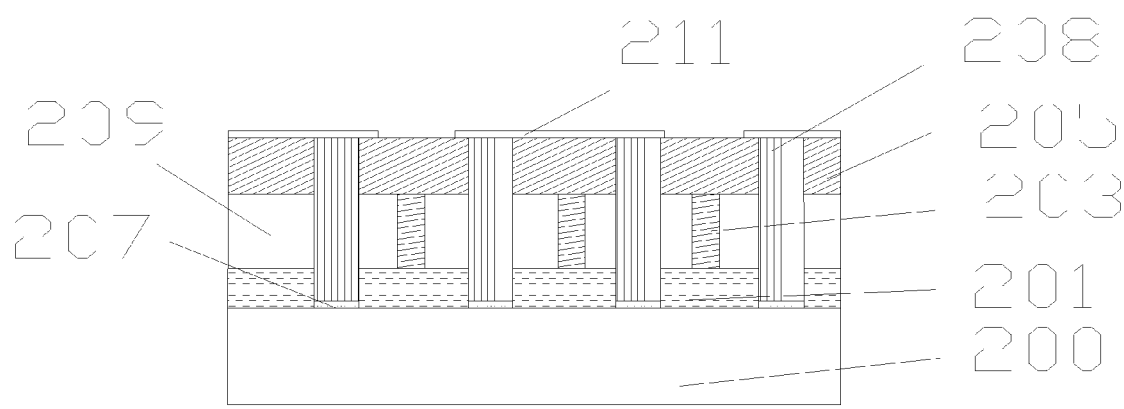

Referring to FIG. 3J, an interconnection structure comprises an interconnection dielectric a substrate 200. The interconnection dielectric comprises in an ascending order a first interconnection dielectric layer 203 and a second interconnection dielectric layer 205, and further comprises a plurality of contact holes or via holes running through the first interconnection dielectric layer 203 and the second interconnection dielectric layer 205. Carbon nanotubes 208 are formed within the contact holes or via holes, and graphene interconnection lines 211 are arranged on the second interconnection dielectric layer 205 for connecting the carbon nanotubes 208. Cavities 209 are arranged between the first interconnection dielectric layer 205 and carbon nanotubes 208. The cavities 209 adjoin the second interconnection dielectric 205 at its top, and adjoin the insulating layer 201) at its bottom. The graphene interconnection lines 211 may be a monolayer or multiple layers.

Figure 1:
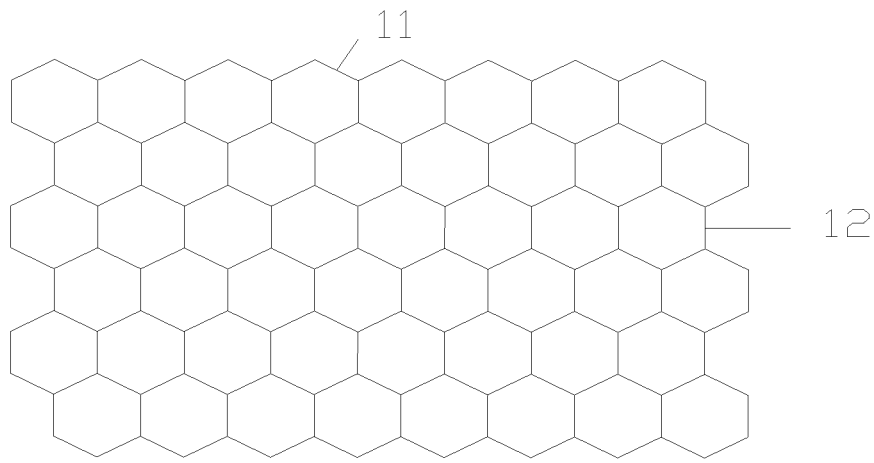
FIG. 1 is a schematic view illustrating the edge state of graphene.
Figure 2:
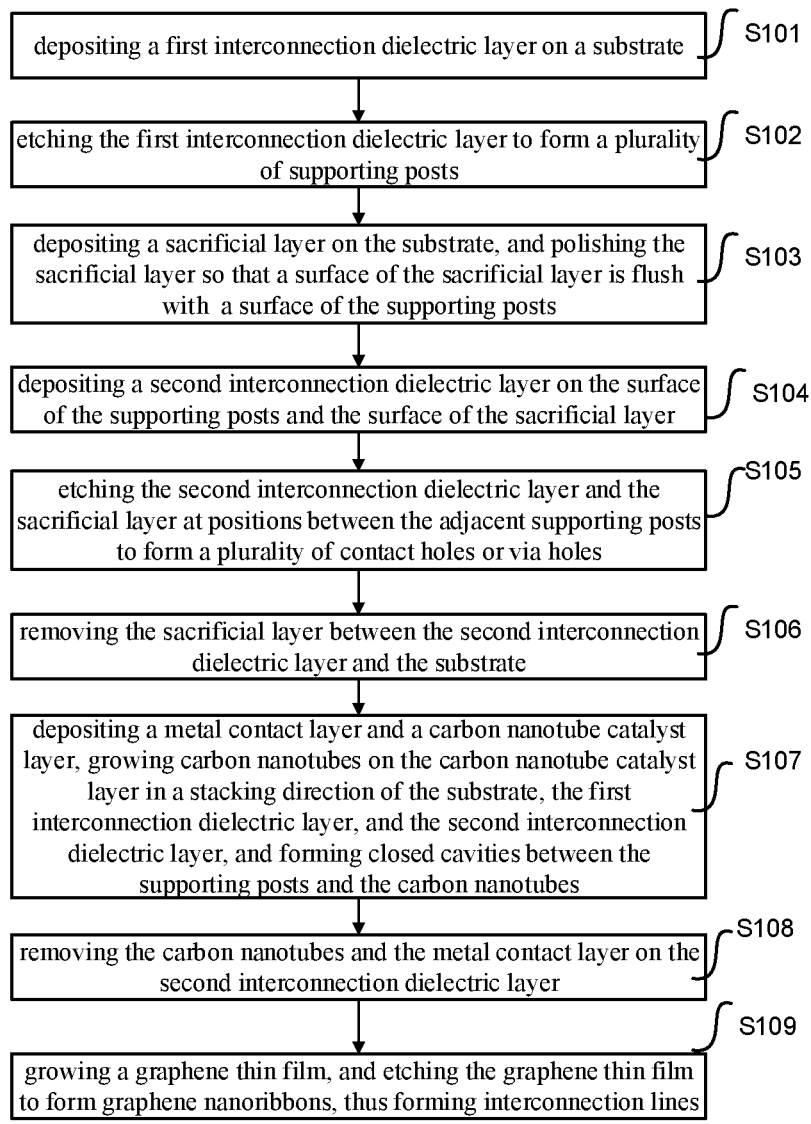
FIG. 2 is a flow chart illustrating a method for fabricating an interconnection structure of the present invention.

The flow chart of the method according to the present invention is shown in FIG. 2.

Referring to FIGS. 3A-3J, according to the present embodiment, the method for fabricating the interconnection structure may comprise the steps of:

in step 101, as shown in FIG. 3A, depositing sequentially on the substrate 200 an insulating layer 201 and the first interconnection dielectric layer 202; the insulating layer 201 may contain a material of SiN or $SiO_2$ and have a thickness of 300-2000 angstrom, while the first interconnection dielectric layer 202 may contain a material of $SiO_2$ and have a thickness of 300-2000 angstrom;

in step 102, as shown in FIG. 3B, etching the first interconnection dielectric layer 202 to form a plurality of supporting posts 203;

in step 103, as shown in FIG. 3C, depositing on the insulating layer 201 a sacrificial layer 204, and polishing the sacrificial layer 204 so that the surface of the sacrificial layer 204 is flush with that of the supporting posts 203; the sacrificial layer 204 may contain a material of silicon or chromium and have a thickness of 500-2000 angstrom; in the present embodiment, the sacrificial layer 204 may contain a material of silicon, and may be removed by using $XeF_2$;

in step 104, as shown in FIG. 3D, depositing on the surface of the above-mentioned structure the second interconnection dielectric layer 205; the second interconnection dielectric layer 205 may contain a material of $SiO_2$, FSG, SiN or and the like, and have a thickness of 300-1000 angstrom;

in step 105, as shown in FIG. 3E, etching the second interconnection dielectric layer 205, the sacrificial layer 204, and the insulating layer 201 at positions between the adjacent supporting posts 203 to form a plurality of contact holes 206;

in step 106, as shown in FIG. 3F, removing the sacrificial layer 204 between the second interconnection dielectric layer 205 and the insulating layer 201 by a release process;

in step 107, as shown in FIG. 3G, depositing on the surface of the above-mentioned structure a metal contact layer 207 and a carbon nanotube catalyst layer (not shown), growing on the carbon nanotube catalyst layer in an ascending order carbon nanotubes 208, and forming cavities 209 between the supporting posts 203 and the carbon nanotubes 208; the metal contact layer and carbon nanotube catalyst layer may be deposited by PVD, CVD, PLD, or ALD, the metal contact layer may contain a material of Ta, TaN, Ti, or TiN, and the carbon nanotube catalyst layer may contain a material of Co, Ni, Pt, or Ru.

The carbon nanotubes 208 and the metal contact layer 207 on the second interconnection dielectric layer 205 may be removed by chemical mechanical polishing. In order to achieve a better effect during chemical mechanical polishing, as shown in FIG. 3H, a third dielectric layer 210 may be deposited on the carbon nanotubes 208 in the region of the contact holes. The carbon nanotubes 208, the third dielectric layer 210, and the metal contact layer 207 on the second interconnection dielectric layer 205 may be removed by polishing which stops on the second interconnection dielectric layer 205, and the resulting structure is shown in FIG. 3I. The third dielectric layer 210 may contain a material of $SiO_2$ or SOG.

Figure 5A:
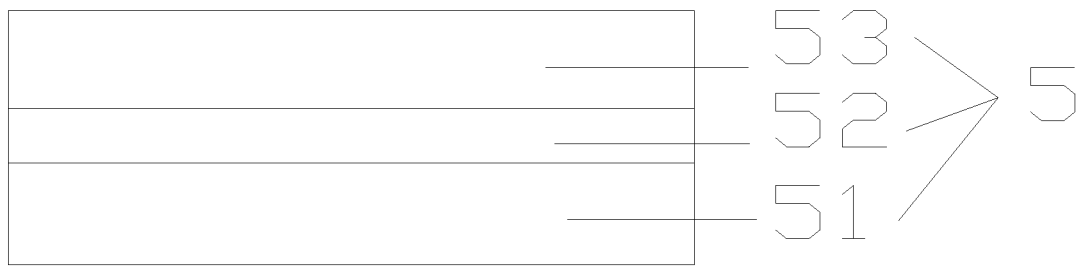
FIGS. 5A-5D are cross-sectional views illustrating respective processing steps during forming a graphene thin film according to the present invention.
Figure 5B:
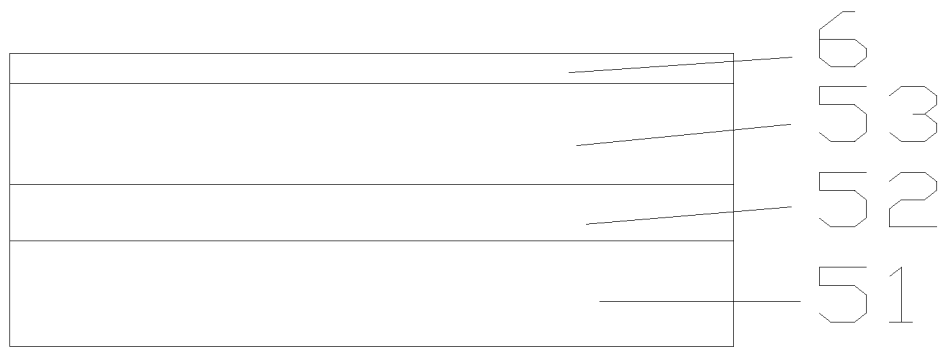
Figure 5C:
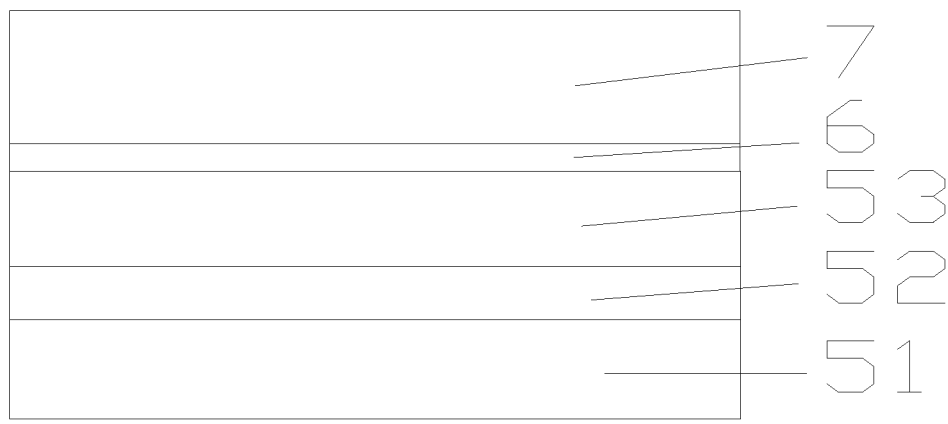
Figure 5D:

As shown in FIG. 3J, a graphene thin film (not shown) may be grown on the surface of the above-mentioned structure, and the graphene thin film may be etched to develop graphene nanoribbons with a zigzag edge, thus forming the first interconnection lines 211. Growing on the surface of the above-mentioned structure the graphene thin film may be accomplished by means of direct deposition by CVD or a physical transferring. In a process in which the graphene thin film is directly deposited by CVD, PECVD, microwave plasma CVD, surface wave plasma CVD, LPCVD, or APCVD can be applied at a temperature of 300° C.~1200° C. Forming the graphene thin film on the surface of the above-mentioned structure by means of a physical transferring may comprise the following steps. As shown in FIG. 5A, the bulk metal substrate 5 may comprise $SiO_2$ 52 and metal catalyst layer 53, which are deposited sequentially on a source substrate 51. The step of forming the graphene thin film 6 on the bulk metal substrate 5 by means of chemical vapor deposition or ion implantation may comprise: forming the graphene thin film 6 on the bulk metal substrate 5 by chemical vapor deposition at a high temperature with a CH4 gas, or by Carbon Ion Implantation. As shown in FIG. 5B, the graphene thin film 6 is formed on the bulk metal substrate 5 by means of chemical vapor deposition or ion implantation. As shown in FIG. 5C, an organic glass 7 is formed on the graphene thin film 6. As shown in FIG. 5D, the bulk metal substrate 5 is removed. The graphene thin film 6 supported by the organic glass 7 is attached to the second interconnection dielectric layer 205. The organic glass 7 is removed, thus forming on the surface of the above-mentioned structure a graphene thin film. The graphene nanoribbons may be a monolayer or multiple layers. The resistivity of the graphene nanoribbons is adjusted by doping or ion implantation.

Figure 4A:
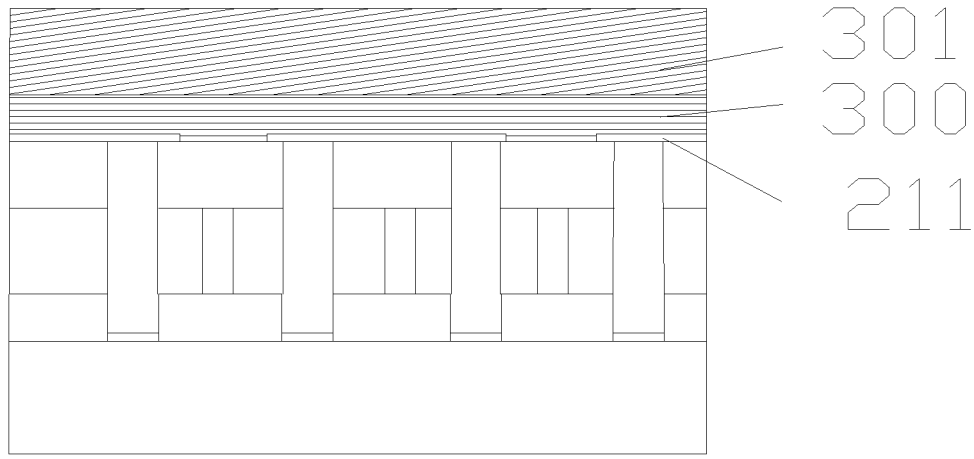
FIGS. 4A-4J are cross-sectional views illustrating respective processing steps in the method according to another embodiment of the present invention.
Figure 4B:
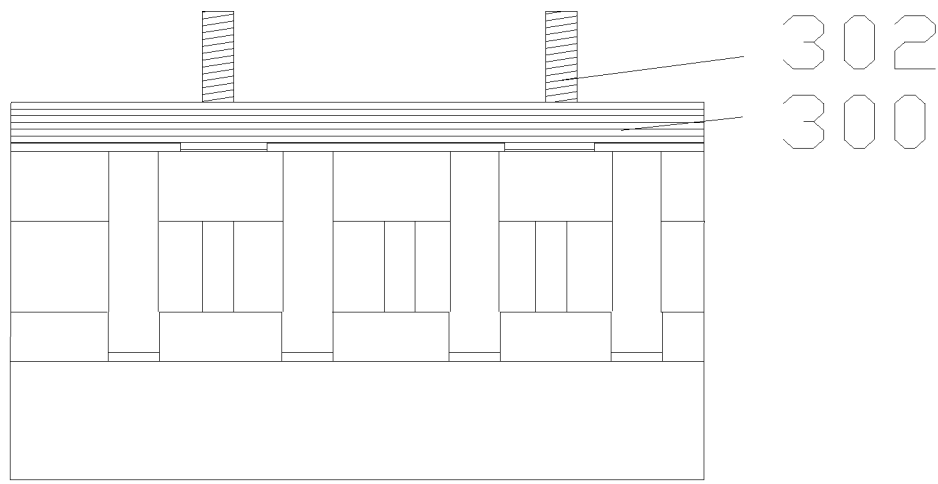
Figure 4C:
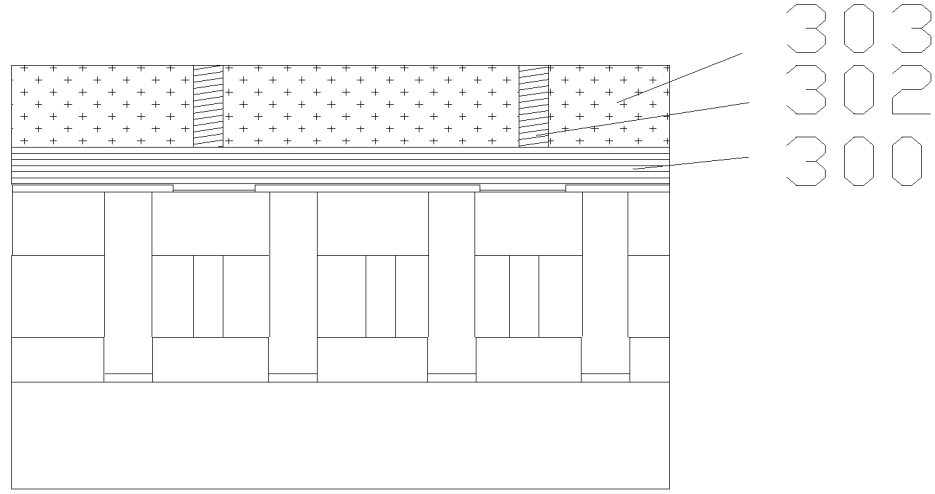
Figure 4D:
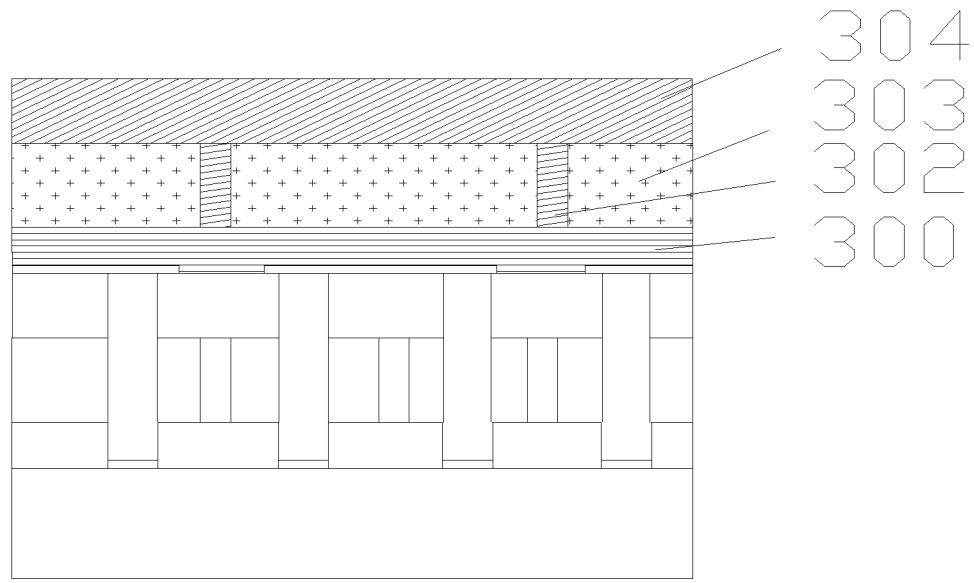
Figure 4E:
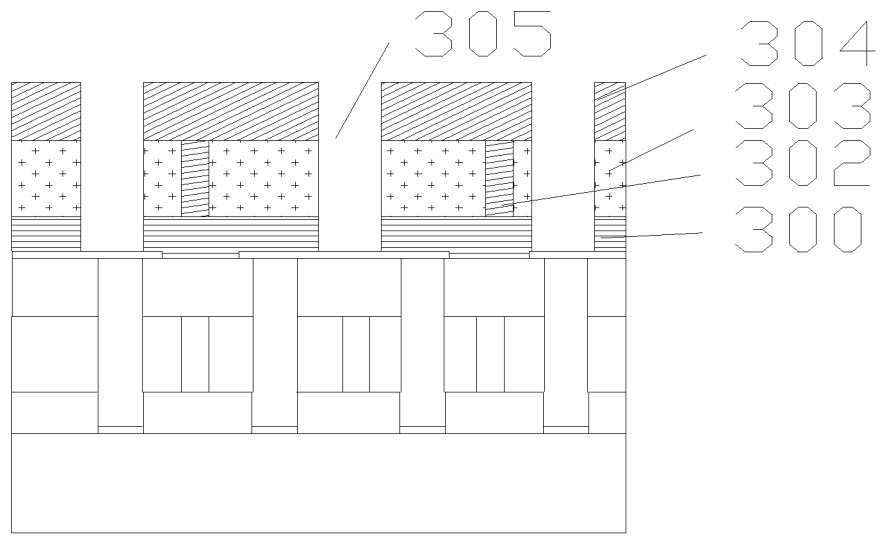
Figure 4F:
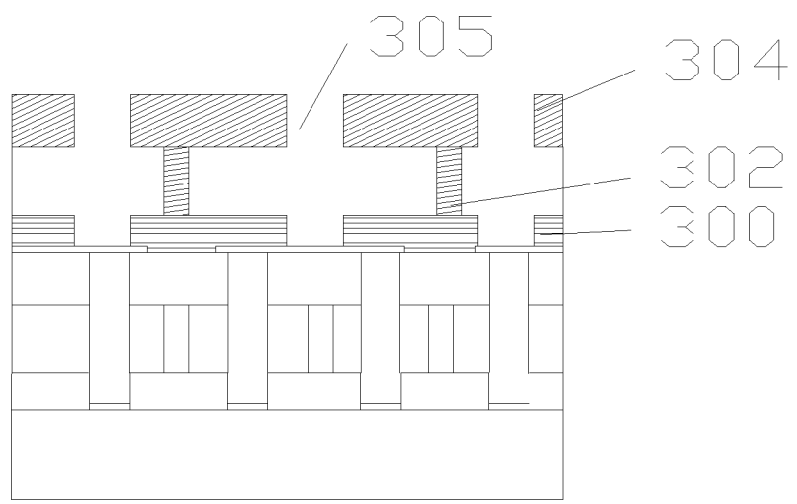
Figure 4G:
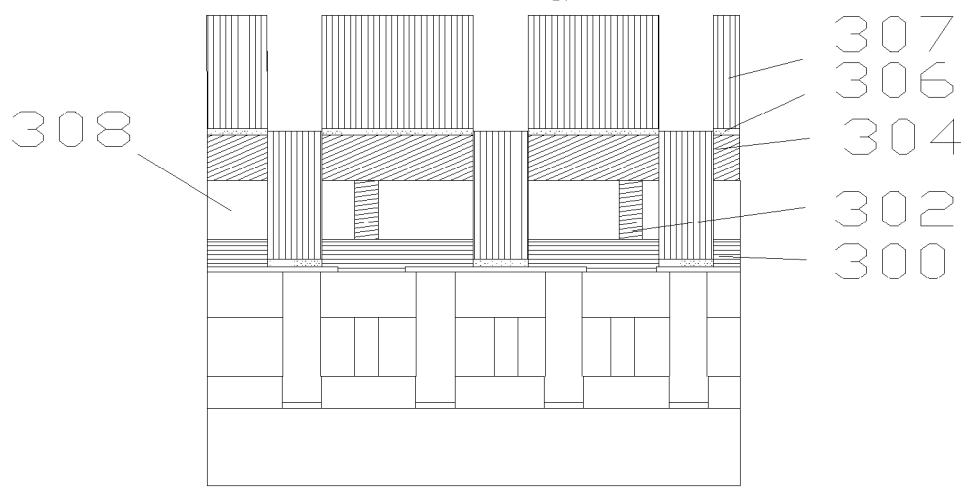
Figure 4H:
Figure 4I:
Figure 4J:
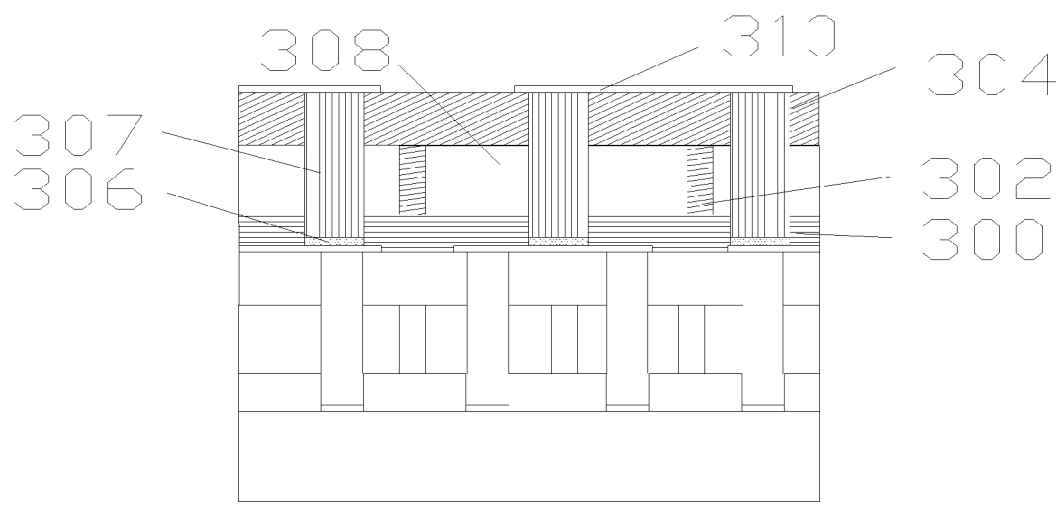

Another embodiment relates to fabrication of the second interconnection layer for via holes, as shown in FIG. 4A-4J, which may comprise the steps of:

as shown in FIG. 4A, depositing on the first interconnection lines 211 a fourth interconnection dielectric layer 300 and a fifth interconnection dielectric layer 301; the fourth interconnection dielectric layer 300 may contain a material of $SiO_2$, FSG, or SiN, and the fifth interconnection dielectric layer 301 may contain a material of $SiO_2$;

as shown in FIG. 4B, etching the fifth interconnection dielectric layer 301 at positions between the adjacent carbon nanotubes 208 to form a plurality of supporting posts 302;

as shown in FIG. 4C, depositing on the fourth interconnection dielectric layer 300 a sacrificial layer 303, and polishing the sacrificial layer 303 so that the surface of the sacrificial layer 303 is flush with that of the supporting posts 302;

as shown in FIG. 4D, depositing on the surface of the above-mentioned structure a sixth interconnection dielectric layer 304; the sixth interconnection dielectric layer 304 may contain a material of $SiO_2$, FSG, or SiN, and have a thickness of 300-1000 angstrom;

as shown in FIG. 4E, etching the sixth interconnection dielectric layer 304, the sacrificial layer 303, and the fourth interconnection dielectric layer 300 at positions between the adjacent supporting posts 302, to form a plurality of via holes 305 in contact with the first interconnection lines 211;

as shown in FIG. 4F, removing the sacrificial layer 303 between the sixth interconnection dielectric layer 304 and the fourth interconnection dielectric layer 300 by a release process;

as shown in FIG. 4G, depositing on the surface of the above-mentioned structure a metal contact layer 306 and a carbon nanotube catalyst layer (not shown), growing on the carbon nanotube catalyst layer in an ascending order carbon nanotubes 307, and forming cavities 308 between the supporting posts 302 and the carbon nanotubes 307;

as shown in FIG. 4H, removing the carbon nanotubes 307 and the metal contact layer 306 on the sixth interconnection dielectric layer 304 by chemical mechanical polishing; wherein in order to achieve a better effect during chemical mechanical polishing, as shown in FIG. 4H, a seventh interconnection dielectric layer 309 containing a material of $SiO_2$ or SOG is formed on the carbon nanotubes 307 in the region of the via holes by deposition or spin coating, the carbon nanotubes 307, the seventh interconnection dielectric layer 309, and the metal contact layer 306 on the sixth interconnection dielectric layer 304 is removed by polishing which stops on the sixth interconnection dielectric layer 304, as shown in FIG. 4I;

as shown in FIG. 4J, growing on the surface of the above-mentioned structure a graphene thin film (not shown), etching the graphene thin film to develop graphene nanoribbons with a zigzag edge, and thus forming the second interconnection lines 310.

The same processes and materials are applied in the second interconnection layer as those in the first interconnection layer. The steps described above may be used to form a third, fourth, or fifth subsequent interconnection layer. According to the present invention, the carbon nanotube interconnection technique has been embedded into the conventional CMOS local Cu interconnection technique. The carbon nanotubes are used as the interconnection material for local interconnection between via holes or contact holes, the graphene nanoribbons are used as the interconnection material for local interconnection between metal lines, and the cavities are used as the interconnection dielectric for local interconnection. In addition, the conventional CMOS BEOL Cu interconnection technique is applied to the intermediate interconnection level and the global interconnection level. In this way, the high parasitic resistance and parasitic capacitance in the Cu interconnection technique, which may occur when the local interconnection is relatively small in size, can be effectively overcome. In the present invention, the carbon nanotubes within via holes or contact holes, as well as the graphene nanoribbons for connecting the carbon nanotubes, greatly reduce the parasitic resistance. The cavities in the interconnection dielectric effectively reduce the interlayer parasitic capacitance. At the same time, the graphene nanoribbons are very thin, so that the parasitic capacitance between their connecting lines is also reduced greatly. Furthermore, the present invention is compatible with the current CMOS Cu interconnection technique, effectively reduces the interconnection RC delay, improves the performance of a chip, and brings the cost of a chip under control.

The preferred embodiments of the present invention have been described above, but all the equivalent variations and modifications in accordance with the scope of the claims of the present invention should fall within the scope of the claims of the present invention.

The invention claimed is:

1. A method for fabricating an interconnection structure, wherein comprising the steps of:
depositing a first interconnection dielectric layer on a substrate;
etching the first interconnection dielectric layer to form a plurality of supporting posts;
depositing a sacrificial layer on the substrate, and polishing the sacrificial layer so that a surface of the sacrificial layer is flush with a surface of the supporting posts;
depositing a second interconnection dielectric layer on the surface of the supporting posts and the surface of the sacrificial layer;

etching the second interconnection dielectric layer and the sacrificial layer at positions between the adjacent supporting posts to form a plurality of contact holes or via holes;

removing the sacrificial layer between the second interconnection dielectric layer and the substrate;

depositing a metal contact layer and a carbon nanotube catalyst layer on a surface of the second interconnection dielectric layer and in the contact holes or via holes, growing carbon nanotubes on the carbon nanotube catalyst layer in a stacking direction of the substrate, the first interconnection dielectric layer, and the second interconnection dielectric layer, and forming closed cavities between the supporting posts and the carbon nanotubes;

removing the carbon nanotubes and the metal contact layer on the second interconnection dielectric layer;

growing a graphene thin film on the surface of the second interconnection dielectric layer and on a surface of the carbon nanotubes in the contact holes or via holes, and etching the graphene thin film to form graphene nanoribbons, thus forming interconnection lines.

2. The method for fabricating an interconnection structure according to claim 1, wherein depositing the first interconnection dielectric layer on the substrate further comprises depositing an insulating layer on the substrate.

3. The method for fabricating an interconnection structure according to claim 1, wherein the sacrificial layer contains a material of silicon or polyamide.

4. The method for fabricating an interconnection structure according to claim 3, wherein the sacrificial layer contains a material of silicon which is removed by using $XeF_2$.

5. The method for fabricating an interconnection structure according to claim 1, wherein the metal contact layer and carbon nanotube catalyst layer are deposited by PVD, CVD, PLD, or ALD.

6. The method for fabricating an interconnection structure according to claim 5, wherein the metal contact layer contains a material of Ta, TaN, Ti, or TiN, and the carbon nanotube catalyst layer contains a material of Co, Ni, Pt, or Ru.

7. The method for fabricating an interconnection structure according to claim 1, wherein growing the graphene thin film on the surface of the second interconnection dielectric layer and on the surface of the carbon nanotubes in the contact holes or via holes is accomplished by means of direct deposition by CVD or a physical transferring.

8. The method for fabricating an interconnection structure according to claim 7, wherein a process in which the graphene thin film is directly deposited by CVD, PECVD, microwave plasma CVD, surface wave plasma CVD, LPCVD, or APCVD is applied at a temperature of 300° C.~1200° C.

9. The method for fabricating an interconnection structure according to claim 7, wherein growing the graphene thin film on the surface of the second interconnection dielectric layer and on the surface of the carbon nanotubes in the contact holes or via holes by means of a physical transferring comprises the steps of:

forming a graphene thin film on a bulk metal substrate;
forming an organic glass on the graphene thin film;
removing the bulk metal substrate;
attaching the graphene thin film supported by the organic glass to the second interconnection dielectric layer;
removing the organic glass.

10. The method for fabricating an interconnection structure according to claim 9, wherein forming the graphene thin film on the bulk metal substrate is accomplished by means of chemical vapor deposition or ion implantation.

11. The method for fabricating an interconnection structure according to claim 9, wherein the bulk metal substrate comprises a source substrate, with a $SiO_2$ layer and a metal catalyst layer deposited sequentially on the source substrate.

12. The method for fabricating an interconnection structure according to claim 1, wherein the graphene nanoribbons are a monolayer.

13. The method for fabricating an interconnection structure according to claim 1, wherein a resistivity of the graphene nanoribbons is adjusted by doping or ion implantation.

14. The method for fabricating an interconnection structure according to claim 1, wherein removing the carbon nanotubes and the metal contact layer on the second interconnection dielectric layer is accomplished by means of chemical mechanical polishing.

15. The method for fabricating an interconnection structure according to claim 14, wherein removing the carbon nanotubes and the metal contact layer on the second interconnection dielectric layer by chemical mechanical polishing further comprises forming an interconnection dielectric layer on the carbon nanotubes in a region of contact holes or via holes by deposition or spin coating.

16. The method for fabricating an interconnection structure according to claim 1, wherein the graphene nanoribbons are multiple layers.

* * * * *